(12) United States Patent
Dielissen

(10) Patent No.: US 6,910,171 B2
(45) Date of Patent: Jun. 21, 2005

(54) LOSSY COMPRESSION OF STAKES IN TURBO DECODER

(75) Inventor: Johannus Theodorus Matheus Hubertus Dielissen, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 466 days.

(21) Appl. No.: 09/945,858

(22) Filed: Sep. 4, 2001

(65) Prior Publication Data

US 2002/0054654 A1 May 9, 2002

(30) Foreign Application Priority Data

Sep. 4, 2000 (EP) .......................................... 00203051

(51) Int. Cl.[7] .......................................... H03M 13/00
(52) U.S. Cl. ...................................................... 714/755
(58) Field of Search .................................. 714/755, 756, 714/757; 375/341, 240, 265

(56) References Cited

U.S. PATENT DOCUMENTS 5,933,462 A * 8/1999 Viterbi et al. ............... 375/341
6,044,116 A * 3/2000 Wang ......................... 375/265
6,327,303 B1 * 12/2001 Balogh et al. ............... 375/240

OTHER PUBLICATIONS

Sun Rong et al., "Nonuniform quantisation of mid–variables for decoding of turbo codes," Mar. 8, 2000, pp. 1396–1397.

F. Raouafi et al., "Saving memory in turbo–decoders using the Max–Log–MAP algorithm," Nov. 22, 1999, pp. 14/1–14/4.

* cited by examiner

Primary Examiner—Guy J. Lamarre
Assistant Examiner—James C Kerveros
(74) Attorney, Agent, or Firm—Aaron Waxler

(57) ABSTRACT

A turbo decoder employing the sliding window algorithm is computational intensive. Computational requirements are reduced in iterative decoders, at the expense of increased memory usage, by storing the stakes between iterations. The stakes used in this improved sliding windows algorithm can be compressed, resulting in a decoder with minimal additional memory requirements, while retaining the advantages in computational requirements obtained from storing the stakes between iterations.

12 Claims, 3 Drawing Sheets

LOSSY COMPRESSION OF STAKES IN TURBO DECODER

BACKGROUND AND SUMMARY

The invention relates to an iterative decoder operative to decode an incoming coded signal with a signal to noise ratio using a sliding window algorithm in which state metrics of a stake are stored for future use as starting points for the backward recursions in a future iteration.

The invention further relates to a method to decode an incoming coded signal with a signal to noise ratio using a sliding window algorithm in which state metrics of a stake are stored for future use as starting points for the backward recursions in a future iteration.

Such an iterative decoder is disclosed by the document 'Organisation de la memoire dans un turbo decodeur utilisant l' algorithme SUB-MAP' by Adod Dingninou, Fathi Raouafi and Claude Berrou, Departement d'electronique, ENST Bretagne, BP 832, 29285 Brest Cedex, France.

This document discloses an iterative turbo decoder that uses the sliding window algorithm. In order to decode a data block using the sliding window algorithm, the decoder starts decoding a certain number of trellis steps before and/or after the data block in order to arrive at good estimates of the state metrics of the first and the last state metric vector of the data block. This is possible because of the converging properties of the state metrics in a trellis. Regardless of the assumed starting state metrics the state metrics will converge towards the right solution after several trellis steps as a result of the code used to encode the data word. Thus in a system where $2^u$ states are in a trellis step possible, which form a state metric vector, the turbo decoder starts approximately 5 u trellis steps before and/or 5 u trellis steps after the data block assuring that the state metrics have sufficiently converged to the yield a reasonable estimate of the state metrics at the beginning and end of the data block that is to be decoded. The state metric vectors at the beginning and end of a data block are called stakes. In the sliding window algorithm the 5 u trellis steps before and/or after the data block are calculated for every iteration.

As an improvement over the sliding window algorithm the document 'Organisation de la memoire dans un turbo decodeur utilisant l' algorithme SUB-MAP' discloses that is advantageous for an iterative decoder to store the stakes for use in the next iteration.

This increases the memory usage, while reducing the need for starting the trellis 5 u steps outside of the data block resulting in a reduced requirement for processing. This is because the stakes obtained from the previous iteration are already fairly accurate estimates of the states at the beginning and the end of the data block, and a repeated forward and backward recursion started 5 u steps outside the trellis would not produce significantly more accurate estimates of the beginning and end state metrics of the data block. Only the state metrics of the stakes need to be stored.

In a system with 8 states and 10 bits for each metric this results in storage requirements of 80 bits per stake. For a total of 5000 trellis steps and one stake every 40 trellis steps the memory requirements are 125*8*10=10 Kbit.

A problem of this decoder is that the additional memory requirements are undesirable compared to the regular sliding window algorithm.

The present invention solves this problem by providing a decoder that is characterized in that the state metrics of the stake are compressed using lossy compression.

By compressing the state metrics of the stakes the amount of memory required is further reduced.

This is based on the realization that by using lossy compression some information of the state metrics in the stake is lost, but if the resulting error is comparable to the error resulting from a backward recursion that was started 5 u outside the data, the backward recursion does not suffer from this loss. Consequently there is no need to store the metrics of the states of the stakes loss less.

An embodiment of the present invention is characterized in that the iterative decoder is operative to compress the state metrics by selecting a particular state and storing only the position of the particular state within the stake.

In a trellis step only the relative weights of the various states, which indicate the cost of arriving at that particular state, are relevant. By only storing the position of the most relevant state the storage requirements are greatly reduced. In the above example only 3 bits are needed to store the position of the most relevant state, reducing the memory requirements from 10 Kbit to 125*3=375 bit.

A further embodiment of the present invention is characterized in that the particular state is the state with the lowest cost of all states of the stake.

The most likely state of a stake is associated with the metric that reflects the lowest cost. By only storing the position within a stake of the state with a metric that is associated with the lowest cost, the values of the metrics are lost and the only information remaining is which state in the trellis is most likely. In the above example memory requirements are reduced from 4 Kbit to 125*3=375 bit while the most useful part of the information, the position of the state which is most likely, is retained. This represents a significant reduction in memory requirements while still providing an adequate starting point for a backward recursion.

Yet a further embodiment of the present invention is characterized in that the iterative decoder is operative to reconstruct the stake by assigning a cost of zero to the state of the stake as indicated by the stored position of the particular state, and assigning predetermined, equal, non zero, costs to all other states of the stake.

The reconstruction of the stake is based on the available information, i.e. the position in the stake of the state with a metric representing the lowest cost. The state metrics of the other states are all set to the same value and this reconstructed stake is then used in the next iteration as a starting point for the backward recursion.

Yet a further embodiment of the present invention is characterized in that the predetermined non equal costs are determined by decoding an encoded word in which the encoded word passes through a first state and which encoded word is noise free and selecting a first state metric vector with a state metric equal to zero found for the first decoded state for reconstructing the stake with a state metric equal to zero as indicated by the stored position of the particular state metric The optimal state metrics to reconstruct the stake are determined by encoding a word and decoding this word while assuring the word is still noise free. When the encoder passes through a state, for instance state 2, in location x while coding the data word, the decoder will find that state 2, at the same location has the lowest cost if the code word is noise free. The state metrics of the state metric vector thus found are associated with, in this example, state 2, and can be regarded as constants and for instance stored in a permanent memory. When a decoder reconstructs a stake where a certain state was indicated by the position that was stored in a previous iteration, that state metric vector stored in the permanent memory is selected that is associated to the same state. For instance the position that was stored during a previous iteration indicates state 2, the decoder reconstructs the stake by retrieving from memory the state metric vector that is associated with state 2 and uses these state metrics in the next iteration.

Yet a further embodiment of the present invention is characterized in that the costs are scaled based on the signal to noise ratio of the incoming signal.

The absolute value of the state metrics of a trellis state reflect the cost of arriving at that state. Therefore, if the signal has a high signal to noise ratio, the likelihood of the states will be more different then when the signal has a low signal to noise ratio. As a consequence the cost to get to a state, as reflected by the state metric, will be more different within a state metric vector for a system with a high signal to noise ratio as well. There will be one state that is clearly more likely in a signal with a high signal to noise ratio, and the cost to arrive at the other possible states will be higher.

In a signal with a low signal to noise ratio none of the states stand out as much more likely and the cost of getting to any state will be similar. Therefore the present invention introduces a scaling factor for the costs, applied to all metrics of all states of the stakes to reflect the signal to noise ratio of the signal.

BRIEF DESCRIPTION OF DRAWINGS

The present invention will now be explained by figures.

DETAILED DESCRIPTION

Figure 1:
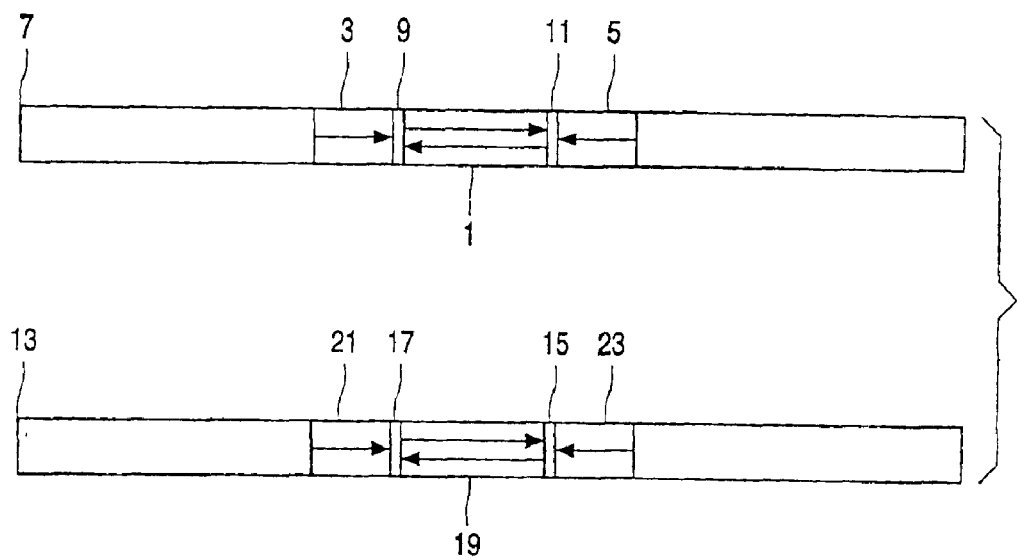
FIG. 1 shows the concept of the sliding window algorithm.

FIG. 1 shows the concept of the sliding window algorithm for two successive iterations performed by a decoder on a data word.

A data block 1 inside a window placed over the data word 7 is to be decoded. For this the decoder starts to decode a distance 3, 5 of 5 u away from the beginning and or end of the data block 1. When the recursion reaches the state metric vector 9, 11 at the beginning and/or end of the data block 1 the estimate of the state metric vectors 9, 11 is pretty accurate. These state metric vectors 9, 11 can then be used as a starting point to decode the data block 1.

In the next iteration the process is repeated and the decoder starts decoding a distance of 5 u away from the beginning and or end of the data block 19. When the trellis reaches the state metric vector 15, 17 at the beginning and/or end of the data block 19 the estimate of the state metric vectors 15, 17 is pretty accurate because the accuracy of the data word 13 is improved as a result of the previous iteration and as a consequence the state metric vectors 15, 17 found in the current iteration is somwhat different then in the previous iteration. The state metric vectors 9, 11, 15, 17 are not stored but calculated every time they are needed. This results in increased computational requirements while at the same time no additional memory for storing the state metric vectors between iterations is needed.

Figure 2:
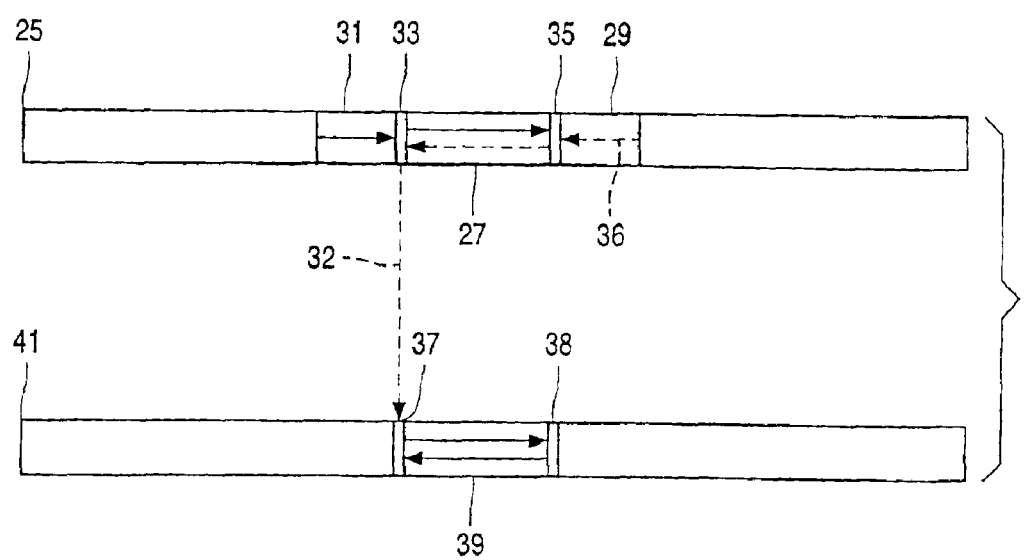
FIG. 2 shows the concept of storing stakes to reduce computations at the expense of memory usage.

FIG. 2 shows the concept of storing stakes to reduce computations at the expense of memory usage. The data word 25 in the first iteration is decoded using the basic sliding window algorithm. For this the decoder starts to decode a distance 29, 31 of 5 u away from the beginning and or end of the data block 27. When the recursion reaches the state metric vector 33, 35 at the beginning and/or end of the data block 27 the estimate of the state metric vector is pretty accurate. Now the data block is decoded and the forward and backward recursion through the data block 27 result in further improvements in the accuracy of the state metric vectors 33 and 35. The state metric vectors 33, 35 are called stakes. The state metric vectors 33 and/or 35 are stored as the stakes to be used in the next iteration. The state metric vector 33 at the beginning of the data block 27 is used as the state metric vector 37 to start the next forward recursion in data block 39 from. The state metric vector 35 at the end of the data block 27 is used as the state metric vector 38 to start the next backward recursion in data block 39 from.

Hence there is no need any more to start decoding 5 u away from the beginning and/or end of the data block reducing the computational requirements at the expense of increased storage requirements.

Figure 3:
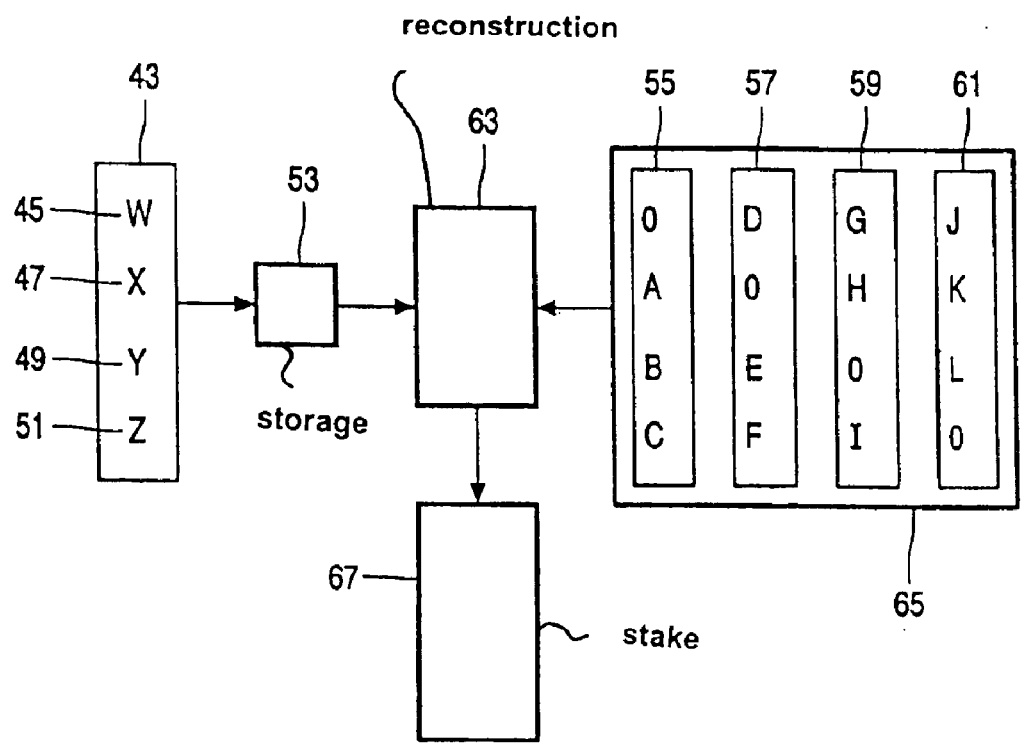
FIG. 3 shows the lossy compression and reconstruction of a stake.

FIG. 3 shows the lossy compression and reconstruction of a stake.

The stake 43 found in an iteration is saved for use in the next iteration as explained in FIG. 2. To reduce the storage requirements not all the state metrics 45, 47, 49, 51 of the stake 43 are stored. Only the position of a particular state metric 45, 47, 49, 51 is being stored. This means that the value of all state metrics 45, 47, 49, 51 are lost in the process. FIG. 3 shows a stake 43 of a system with 4 possible states. If state metric 45 is selected to be the particular state, for instance because it is associated with the lowest cost to get to this state, only the position of the state metric 45 in the stake 43 is stored in storage 53, in this example the position is position 0 and only the value 0 would be stored. In a system with 4 states only 2 bits are required for each stake to store a position, and in a system with 8 states only 3 bits are needed for each stake.

In the next iteration the decoder retrieves the position from storage 53 and a reconstruction means 63 reconstructs a stake 67 based on the information retrieved from the storage 53 and from the storage 65. In storage 65 a state metric vector 55, 57, 59, 61 is stored for each possible state of the system. The reconstruction means 63 selects a state metric vector 55, 57, 59, 61 from the storage 65 which is associated to the same state of the system as indicated by the position retrieved from storage 53 and reconstructs the stake by copying the appropriate state metrics 0, A, B, C, D, E, F, G, H, I, J, K, L from the selected state metric vector 55, 57, 59, 61 to the stake 67 to be reconstructed.

This way the memory requirements are greatly reduced, while retaining the advantages of the sliding window algorithm and the reduced computational requirements as offered by the concept of FIG. 2.

Figure 4:
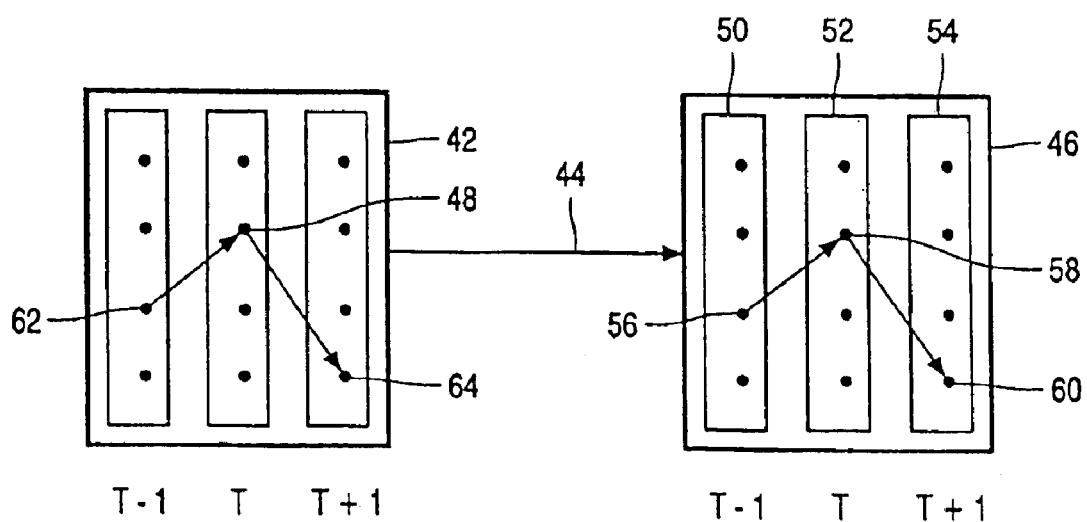
FIG. 4 shows the determination of the state metric vectors to be used to reconstruct a stake.

FIG. 4 shows the determination of the state metric vectors to be used to reconstruct a stake In FIG. 4 the encoder 42 passes through a state 48 at time T while encoding a data word. This means that when the data word is decoded by decoder 46, after being transmitted via a noise free channel 44, the decoder will find that state 58 has the lowest cost at time T. The associated state metric vector 52 can now be regarded as typical for state 58. By ensuring that encoder 42 passes through all states 62, 48, 64 the typical state metric vectors 50, 52, 54 are obtained for each state 56, 58, 60. This operation only needs to be performed once and the resulting state metric vectors 50, 52, 54 can be stored for future use. For a system with 4 possible states, 4 typical state metric vectors are obtained. These state metric vectors effectively become the state metric vectors 55, 57, 59, 61 stored in storage 65 in FIG. 3. When the decoder 46 reconstructs the stakes before an iteration the position stored during the previous iteration indicates a state for the stake to be reconstructed. The decoder 46 then selects the stored state metric vector 55, 57, 59, 61 and reconstructs the stake by copying the state metrics from the selected state metric vector to the stake to be reconstructed.

Figure 5:
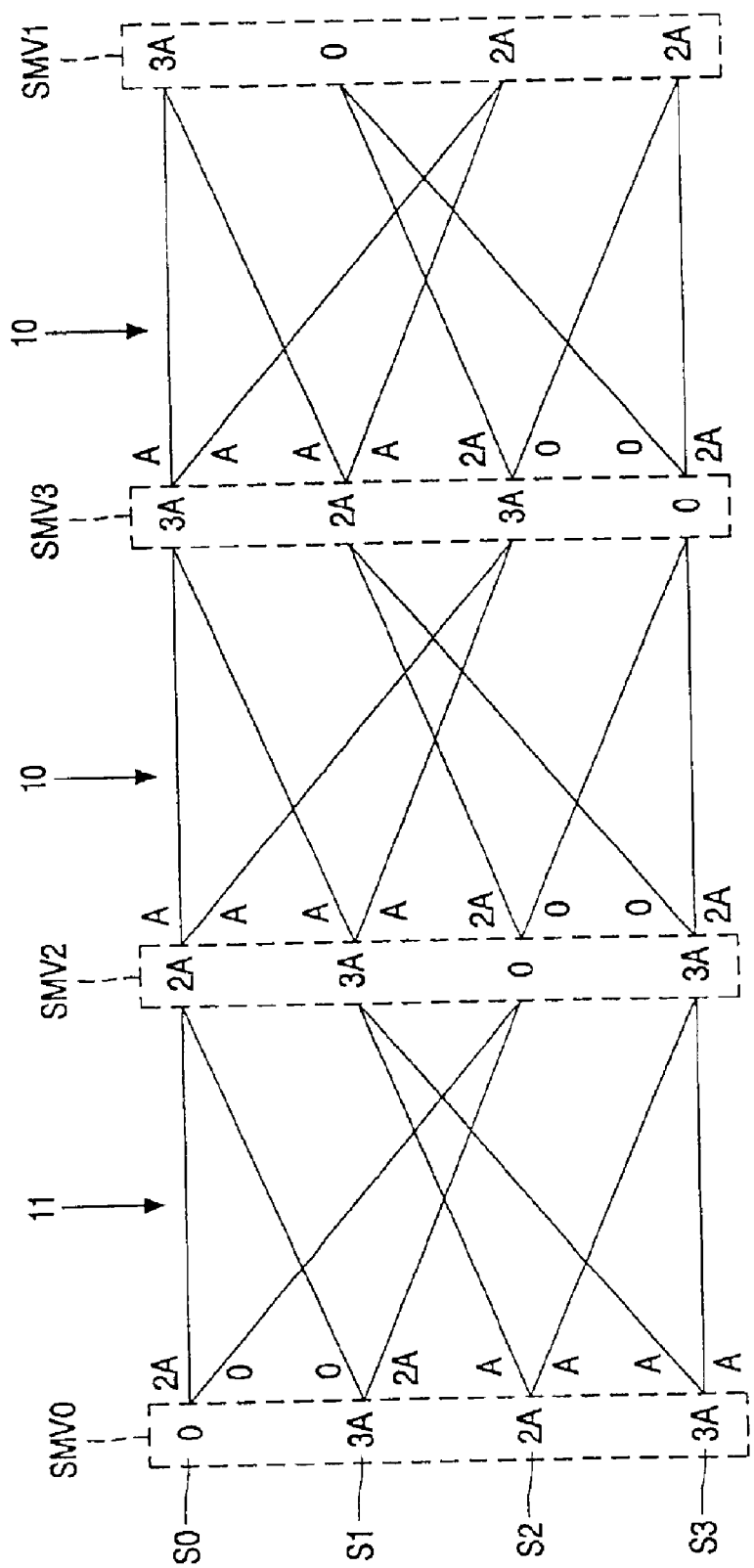
FIG. 5 shows the trellis of a system with 4 states and the determination of the state metric vectors to be used during reconstruction of a stake.

FIG. 5 shows the trellis of a system with 4 states and the determination of the state metric vectors to be used during reconstruction of a stake.

For a system where 4 states are possible and the decoder is of the MAX-LOG-MAP type the equations to calculate the state metric vectors S0, S1, S2, S3 are:

$$S0(k+1)=\min(S0(k)+0, S1+2A)$$

$$S1(k+1)=\min(S2+A, S3+A)=A+\min(S2, S3)$$

$$S2(k+1)=\min(S0+2A, S1+0)$$

$$S3(k+1)=\min(S2+A, S3+A)=A+\min(S2, S3)$$

Solving these equations leads to state metric vector SMV0=(0, 3A, 2A, 3A) of the zero code word.

The other 3 state metric vectors SMV1, SMV2, SMV3 are derived from state metric vector SMV0 as described in FIG. 4.

Starting with the state metric vector SMV0 the cost associated with going from one state to another in the trellis is indicated by 0, A and 2A along the transition paths in the trellis. For instance the state metric vector for state 0 SMV0 is (S0, S1, S2, S3) with values (0, 3A, 2A, 3A). To transit from state 0 to state 2 the cost of the trellis step must be added to the state metrics of the state metric vector SMV0. This results in a new state metric vector SMV2 with state metrics (2A, 3A, 0, 3A). In the same fashion the state metric vector SMV3 for state 3 and state metric vector SMV1 for state 1 are obtained successively. When the position of the state metric indicating the lowest cost (indicated by a 0) of getting to the associated state stored in a previous iteration is for instance indicating state 2, the selected state metric vector used to reconstruct the stake is state metric vector SMV2 with state metrics (2A, 3A, 0, 3A). In the example of FIG. 5 starting from a state metric vector SMV0 the code bits '11' as generated by the encoder when going from state 0 to state 2, cause the decoder to change srom state metric vector SMV0 to state metric vector SMV2.

The following state metrics for the state metric vectors SMV2, SMV3 and SMV1 are thus obtained:

$$SMV2=(2A, 3A, 0, 3A)$$

$$SMV3=(3A, 2A, 3A, 0)$$

$$SMV1=(3A, 0, 3A, 2A)$$

These state metric vectors S0, S1, S2, and S3 can be stored in the storage 65 of FIG. 3 as the state metric vectors 55, 57, 59, 61 to be used during the reconstruction of stakes by the reconstruction means 63. Since they can be determined before hand these state metrics S0, S1, S2 and S3 can be stored in a storage 65 which is permanent.

What is claimed is:

1. Decoder operative to iteratively decode an incoming coded signal comprising: a sliding window algorithm in which state metrics of a stake are used as starting points for a backward recursion or a forward recursion in a next iteration wherein the state metrics of the stake being stored in a memory are stored in a lossy compressed form.

2. Decoder according to claim 1, wherein the decoder compresses the state metrics by selecting a particular state metric and storing only the position of the particular state metric within the stake.

3. Decoder according to claim 2, wherein the particular state metric is the state metric representing a lowest cost of all state metrics of the stake.

4. Decoder according to claim 3, wherein the decoder reconstructs the stake by assigning a state metric representing a cost of zero to the state metric of the stake as indicated by the stored position of the particular state metric, and assigning predetermined, equal, non zero, costs to all other state metrics of the stake.

5. Decoder according to claim 3, wherein the decoder reconstructs the stake by assigning a state metric representing a cost of zero to the state metric of the stake as indicated by the stored position of the particular state metric, and assigning predetermined non equal costs to all other states of the stake.

6. Decoder according to claim 4, wherein the costs are scaled based on the signal to noise ratio of the incoming signal.

7. Decoder according to claim 4, wherein the predetermined costs are stored in a permanent storage.

8. Communications receiver comprising a decoder according to claim 1.

9. Mobile telephone comprising a communications receiver according to claim 8.

10. Multimedia device comprising a communications receiver according to claim 8.

11. A decoder operative to iteratively decode an incoming coded signal comprising:

a sliding window algorithm in which state metrics of a stake are used as starting points for a backward recursion or a forward recursion in a next iteration, wherein the state metrics of the stake being stored in a memory are stored in a lossy compressed form and the particular state metric is the state metric representing a lowest cost of all state metrics of the stake; wherein the decoder reconstructs the stake by assigning a state metric representing a cost of zero to the state metric of the stake as indicated by the stored position of the particular state metric, and assigning predetermined non equal costs to all other states of the stake; and wherein the predetermined non equal costs are determined by a backward recursion on an associated code word chosen such that after several backward recursion steps the coat of each state remains the same, relative to the other states in the recursion step and between two successive recursion steps, and that the backward recursion results in the lowest possible cost for that state.

12. A decoder operative to iteratively decode an incoming coded signal comprising:

a sliding window algorithm in which state metrics of a stake are used as starting points for a backward recursion or a forward recursion in a next iteration, wherein the state metrics of the stake being stored in a memory are stored in a lossy compressed form and the particular state metric is the state metric representing a lowest cost of all state metrics of the stake; wherein the decoder reconstructs the stake by assigning a state metric representing a cost of zero to the state metric of the stake as indicated by the stored position of the particular state metric, and assigning predetermined non equal costs to all other states of the stake; and wherein the predetermined non equal costs are determined by decoding an encoded word in which the encoded word passes through a first state and which encoded word is noise free and selecting a first state metric vector with a state metric equal to zero found for the first decoded state for reconstructing the stake with a state metric equal to zero as indicated by the stored position of the particular state metric.

* * * * *